(12) United States Patent
Spaeth et al.

(10) Patent No.: US 10,924,104 B2
(45) Date of Patent: Feb. 16, 2021

(54) POWER SWITCH SYSTEM

(71) Applicant: Robert Bosch GmbH, Stuttgart (DE)

(72) Inventors: Alexander Spaeth, Muensingen (DE); Joachim Joos, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/695,412

(22) Filed: Nov. 26, 2019

(65) Prior Publication Data

US 2020/0169252 A1 May 28, 2020

(30) Foreign Application Priority Data

Nov. 26, 2018 (DE) .................. 10 2018 220 247

(51) Int. Cl.
*H02M 1/00* (2006.01)
*H02H 9/00* (2006.01)
*H02M 1/088* (2006.01)
*H03K 17/16* (2006.01)
*H02M 3/158* (2006.01)

(52) U.S. Cl.
CPC ........... *H03K 17/162* (2013.01); *H02H 9/001* (2013.01); *H02M 3/158* (2013.01); *H03K 17/167* (2013.01); *H03K 2217/0072* (2013.01)

(58) Field of Classification Search
CPC .......... H02M 3/158; H02M 2001/0029; H02H 9/001; H03K 2217/0072; H03K 17/162; H03K 17/164; H03K 17/167
See application file for complete search history.

(56) References Cited

U.S. PATENT DOCUMENTS

| | | | | |
|---|---|---|---|---|
| 9,614,372 B2* | 4/2017 | Zhou | .................... | H02M 3/158 |
| 9,870,984 B2* | 1/2018 | Ranmuthu | ........ | H01L 23/49524 |
| 10,110,217 B2* | 10/2018 | Senda | ................ | H03K 17/0828 |
| 2003/0038615 A1* | 2/2003 | Elbanhawy | ........ | H03K 17/6871 |
| | | | | 323/282 |

(Continued)

OTHER PUBLICATIONS

Synchronwandler [Synchronous buck converter] Dec. 17, 2017, Wikipedia: https://de.wikipedia.org/w/index.php?title=Synchronwandler &oldid=172052951.

*Primary Examiner* — Thienvu V Tran
*Assistant Examiner* — Sisay G Tiku
(74) *Attorney, Agent, or Firm* — Norton Rose Fulbright US LLP; Gerard Messina

(57) ABSTRACT

A power-switch-system (PSS) having a low-side transistor (LSS) and a high-side transistor (HSS), which are switchable to be conductive or switched to be blocking in respectively alternating time-segments of a switching-period of the PSS. A source-terminal of the LSS is connected to a load-terminal, and a drain-terminal of the LSS is connected to a supply-voltage via a storage-inductor. A drain-terminal of the HSS is connected to the load-terminal, and a source-terminal of the HSS is connected to the supply-voltage via the storage-inductor. Provided is a PSS of this kind, the LSS having at least two transistor-segments. At least two of the transistor-segments have a different electrical resistance in the connection to the storage-inductor. The PSS provides that at least two of the transistor-segments are switched at a different point in time during a switching operation of the PSS to reduce unwanted voltage fluctuations, without markedly increasing switching losses.

8 Claims, 3 Drawing Sheets

(56) References Cited

U.S. PATENT DOCUMENTS

| | | | |
|---|---|---|---|
| 2003/0228729 A1* | 12/2003 | Efland | H01L 21/765 438/207 |
| 2008/0265851 A1 | 10/2008 | Zhang | |
| 2009/0001949 A1* | 1/2009 | Komori | H02M 3/1588 323/272 |
| 2010/0001703 A1* | 1/2010 | Williams | H02M 3/1584 323/283 |
| 2012/0068678 A1* | 3/2012 | Hatae | H01L 25/16 323/272 |
| 2012/0268091 A1 | 10/2012 | Takemae | |
| 2013/0043829 A1 | 2/2013 | Gurlahosur | |
| 2014/0111170 A1 | 4/2014 | Shi et al. | |
| 2014/0210447 A1* | 7/2014 | Rutkowski | H02J 1/00 323/311 |
| 2014/0210548 A1* | 7/2014 | Shi | H02M 1/088 330/127 |
| 2018/0351546 A1* | 12/2018 | Horvath | H03K 17/284 |

* cited by examiner

… … US 10,924,104 B2 …

POWER SWITCH SYSTEM

FIELD OF THE INVENTION

The present invention relates to a power switch system comprising a low-side transistor and a high-side transistor, which are configured in such a way that in respectively mutually alternating time segments of a switching period of the power switch system they are switched to be conductive or blocking, a source terminal of the low-side transistor being connected to a load terminal and a drain terminal of the low-side transistor being connected to a supply voltage via a storage inductor, and a drain terminal of the high-side transistor being connected to the load terminal, and a source terminal of the high-side transistor being connected to a supply voltage via a storage inductor.

BACKGROUND INFORMATION

Such a power switch system is also called a synchronous DC-DC buck converter and is fundamentally in its construction an extension of a step-down converter, in which the otherwise utilized diodes has been replaced by a further power transistor. The operation of such a power switch system is generally divided into two time segments per switching period. During the first time segment, the low-side power transistor has a low resistance and conducts, whereas the high-side power transistor is in a high-resistance state and blocks. The input voltage is applied across the storage inductor. As a consequence, the coil current rises in a linear manner and results in an energy absorption of the storage inductor. In the second time segment, the low-side power transistor blocks, while the high-side power transistor conducts. The voltage applied across the storage inductor corresponds to the difference between the output voltage and the input voltage. In the process, the coil current in the storage inductor decreases and the storage inductor gives off energy to the output side of the synchronous DC-DC buck converter. In unidirectional operation, the coil current of the storage inductor remains positive. Energy is hereby only transmitted from the input side to the output side.

If a power switch, which comprises for example MOSFET or IGBT, is switched over, it does not suddenly transition from the non-conductive to the conductive state (or vice versa). Rather, depending on the charge current of the gate capacitor, the transistor passes through a certain resistance range. During the switchover, while current is flowing, a more or less high power is converted in the transistor, which heats it up and may even damage it in the worst case scenario. It is therefore normally desired to configure the switchover operation of the transistor to be as brief as possible in order to keep the switching losses as low as possible.

Quick switching operations, however, produce overvoltages by sudden commutation of the current to internal parasites of the connected electronic components. In particular modern electrical systems of motor vehicles/rail vehicles/airplanes (with voltages of, for example, 24 V/48 V) normally have a low tolerance for overvoltages (compared to, for example, 12 V vehicle electrical systems). At the same time, due to progressive miniaturization, electromagnetic compatibility (EMC) is increasingly important and overvoltages damaging to components should be avoided as much as possible.

To improve the EMC emissions (for example for adhering to the CISPR 22 standard) and to reduce the overvoltage, it is known in the related art to preconnect a gate series resistor in a driver circuit, which slows down the switching operation subsequently. This increases switching losses, however. The heat produced must then be dissipated by additional cooling. Overall, therefore, the efficiency and the service life of the power switch are reduced.

SUMMARY OF THE INVENTION

The present invention provides a power switch system of the kind mentioned at the outset, which is characterized in that the low-side transistor comprises at least two transistor segments, at least two of the transistor segments having a different electrical resistance in the connection to the storage inductor, the power switch system being configured in such a way that at least two of the transistor segments are switched at a different point in time during a switching operation of the power switch system.

Due to the overvoltage risk described above, greater safety must be factored in when configuring power switches in order to protect the power switch, which results in additional costs in the configuration and the production of the power switches. The approach according to the present invention makes it possible to improve the spectrum of the voltage fluctuations by modulating the switching edges, without increasing the losses. This makes it possible to achieve a greater steepness in the center section of the switching edge in comparison to the known gate series resister control. At the same time, it is possible to reduce voltage oscillations on parasitic inductances, which improves the EMC compatibility and makes it possible to avoid overvoltages.

With this type of modulation, it is possible to modulate both the switch-off operation as well as the switch-on operation. Tests yield for example markedly dampened oscillations in the phase voltage and the output voltage of a connected converter (DC-DC/AC-DC/DC-AC/AC-AC). The greater steepness of the switching edge in the middle of the switching operation and the lower switching time result in lower switching losses, while improving the EMC emission nevertheless.

The present invention thus makes it possible not to change the steepness of the voltage switching edge in the midsection. Only at the beginning and at the end of the switching operation is the steepness of the edge markedly modulated, and unwanted oscillations are thus avoided. The modulation is achieved by the time-delayed or "staggered" switching of differently sized transistor segments since different time-dependent path resistances of the low-side power transistor result in the process. The overvoltage is reduced/avoided in that the sudden commutation of the current is prevented by the staggered switching of the "one low-side transistor" that is visible from outside.

Advantageous further developments of the present invention are indicated in the further embodiments and descriptions herein as described in the specification.

In one specific embodiment, at least two of the transistor segments comprise differently sized area proportions of the low-side transistor. Apart from a little more overhead, the area on the chip of the low-side transistor remains constant in spite of segmentation. The differently sized area proportions result in different path resistance values of the transistor segments. Due to the time-staggered switching on/switching off of the individual transistor segments within a short period, the current is not forced to commutate suddenly. Overvoltage and subsequent build-up are prevented, which results in improvements in the spectrum. The steepness of the voltage switching edge (for example of the drain voltage of the low-side transistor) is hardly influenced in the process and thus the switching losses are kept low.

The power switch system may be configured in such a way that each transistor segment is assigned to a separate gate segment of the gate terminal of the low-side transistor, the associated transistor segment being switched by switching one of the gate segments. The gate terminal is then likewise segmented in accordance with the transistor segments so that switching a gate segment effects the switching of the associated transistor segment.

In one specific embodiment, the power switch system is configured in such a way that the time interval during a switching operation between switching two consecutively connected transistor segments is less than 100 ns, which may be less than 30 ns, which may be less than 5 ns. The power switch system may be configured such a way that the time interval during a switching operation between switching to consecutively connected transistor segments is respectively less than Ts, Ts being the effective length of the switching operation. The time intervals may vary between the individual pairs of consecutively connected transistor segments.

In another specific embodiment, the power switch system is configured in such a way that in a switching operation of the low-side transistor the transistor segments are switched in a manner that is sorted in accordance with their electrical resistance to the storage inductor. This makes it possible for the switching operation to occur sequentially and, in spite of the steep switching edge in the middle of the switching operation (low switching losses) to reduce unwanted voltage oscillations at the end of the switching edge (good EMC behavior).

In one specific embodiment, the power switch system is configured in such a way that in a switch-on operation of the low-side transistor the transistor segments are switched on in sequence from the highest resistance to the lowest resistance in a time-staggered manner. The transistor segment having the highest resistance may then have for example the smallest area proportion of the low-side transistor, while the transistor segment having the lowest resistance may have the greatest area proportion of the low-side transistor. In a switch-on operation of the low-side transistor, the transistor segments are then switched on in a time-staggered manner in sequence from the lowest area proportion to the highest area proportion.

In another specific embodiment, the power switch system is configured in such a way that in a switch-off operation of the low-side transistor the transistor segments are switched off in sequence from the lowest resistance to the highest resistance in a time-staggered manner. The transistor segment having the lowest resistance may then have for example the greatest area proportion of the low-side transistor, while the transistor segment having the highest resistance may have the smallest area proportion of the low-side transistor. In a switch-off operation of the low-side transistor, the transistor segments are then switched on in a time-staggered manner in sequence from the highest area proportion to the lowest area proportion.

Exemplary embodiments of the present invention are explained in greater detail with reference to the drawings and the following description.

DETAILED DESCRIPTION

Figure 1:
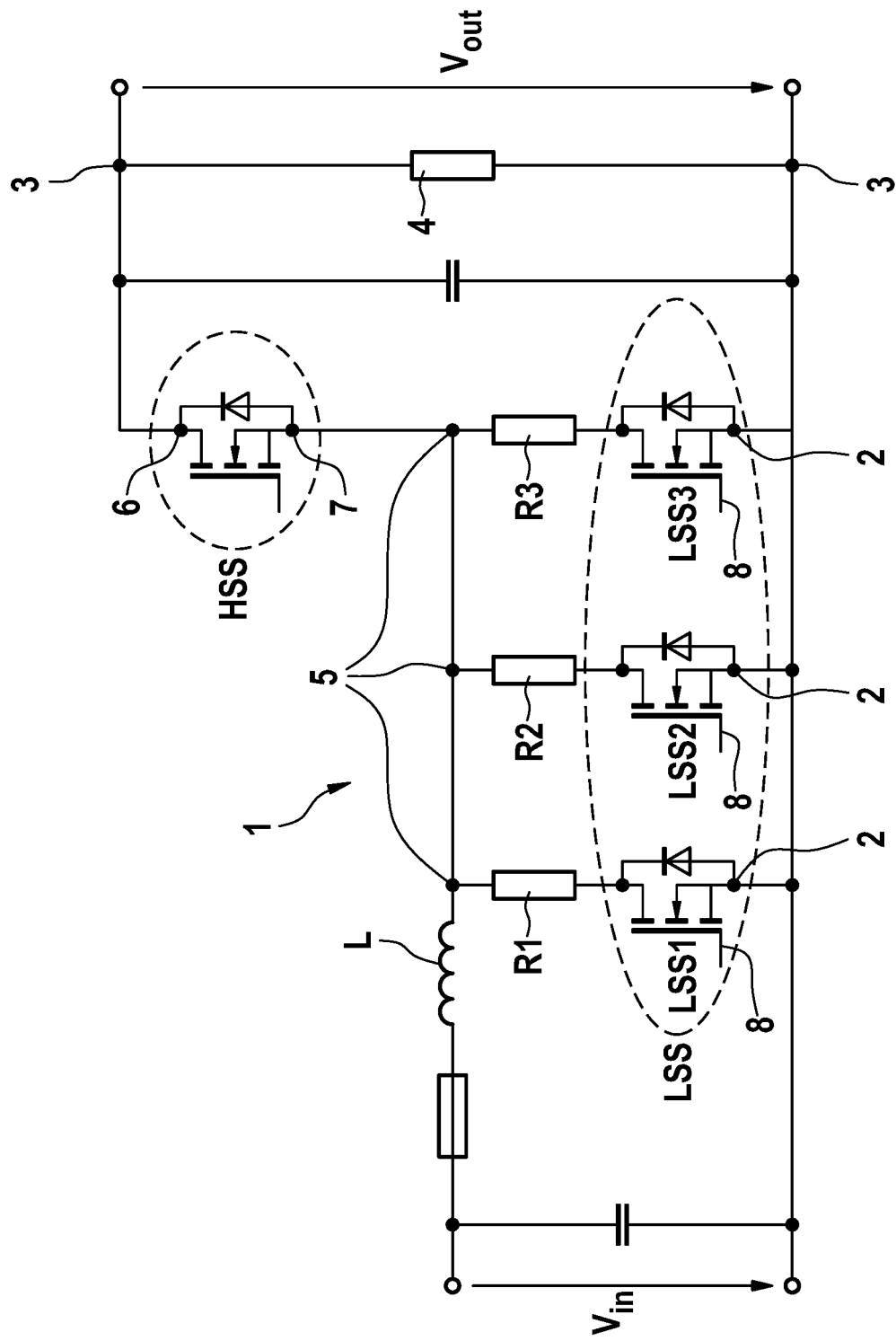
FIG. 1 shows a circuit diagram of a specific embodiment of a power switch system according to the present invention.

FIG. 1 shows a circuit diagram of a specific embodiment of a power switch system 1 according to the invention comprising a low-side transistor LSS and a high-side transistor HSS. The low-side transistor LSS and the high-side transistor HSS are configured in such a way that they are switched to be conductive or switched to be blocking in time segments of a switching period of power switch system 1 that are respectively alternating relative to one another. A source terminal 2 of low-side transistor LSS is connected to a load terminal 3, via which a connected load 4 is supplied with an output voltage $V_{out}$. A drain terminal 5 of the low-side transistor LSS is connected to a supply voltage $V_{in}$ via a storage inductor L.

A drain terminal 6 of the high-side transistor HSS is connected to load terminal 3, and a source terminal 7 of high-side transistor HSS is connected to supply voltage $V_{in}$ via storage inductor L.

According to the present invention, the low-side transistor LSS now comprises at least two (here three) transistor segments LSS1, LSS2, LSS3. At least two of the transistor segments LSS1, LSS2, LSS3 have in the connection to storage inductor L a different electrical resistance R1, R2, R3. The transistor segments LSS1, LSS2, LSS3 are here represented as power transistors, connected in parallel, having separate path resistances R1, R2, R3, although they are in fact combined in a common low-side transistor LSS. Alternatively, the transistor segments LSS1, LSS2, LSS3 may also be connected in parallel as discrete components. Power switch system 1 is configured in such a way that at least two of the transistor segments LSS1, LSS2, LSS3 are switched at a different point in time during a switching operation of power switch system 1.

At least two of the transistor segments LSS1, LSS2, LSS3 may comprise differently sized area proportions of low-side transistor LSS. Apart from a little more overhead, the area on the chip of low-side transistor LSS remains constant with respect to a non-segmented low-side transistor. The differently sized area proportions result in different path resistance values R1, R2, R3 of the transistor segments LSS1, LSS2, LSS3. Due to the time-staggered switching on of the individual transistor segments LSS1, LSS2, LSS3 within a short time, the current is not forced to commutate suddenly. Overvoltage and subsequent build-up are prevented, which results in improvements in the spectrum. In the ideal case, the steepness of the voltage switching edge (for example of the drain voltage of low-side transistor LSS) is not influenced in the process. Alternatively, transistor segments LSS1, LSS2, LSS3 may comprise area proportions of equal size, it then being possible to interconnect differently dimensioned resistors to storage inductor L. In the circuit in FIG. 1, resistors R1, R2, R3 are then to be understood as separate switching elements and not, as may be provided, as representations of the different path resistances of transistor segments LSS1, LSS2, LSS3.

Each one of the transistor segments may be assigned to its own gate segment 8 of the gate terminal of low-side transistor LSS, the associated transistor segment LSS1, LSS2, LSS3 being switched by switching one of gate segments 8. The gate terminal is then likewise segmented in accordance with the transistor segments LSS1, LSS2, LSS3 so that switching a gate segment 8 effects the switching of the associated transistor segment LSS1, LSS2, LSS3.

Figure 2:
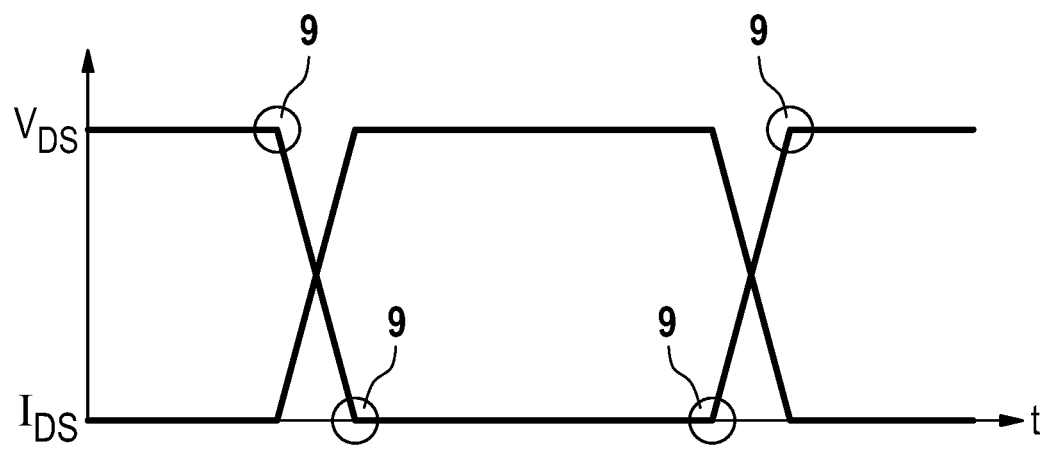
FIG. 2 shows a simplified diagram of the drain current and the drain voltage of a power switch in the related art.
Figure 3:
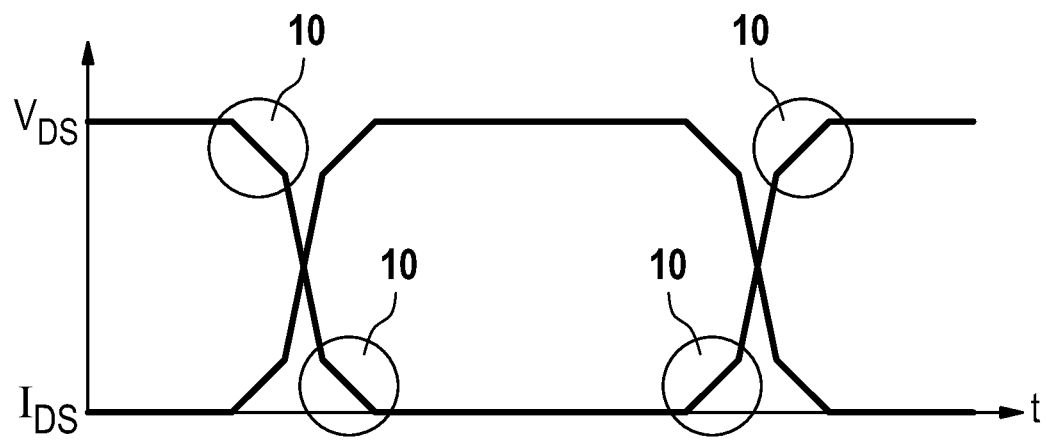
FIG. 3 shows a simplified diagram of the drain current and the drain voltage of a power switch system according to the invention.

FIGS. 2 and 3 elucidate the background of the present invention. A simplified diagram respectively shows the drain current and the drain voltage of a low-side transistor LSS over time t across two switching operations.

FIG. 2 shows the drain current $I_{DS}$ and the drain voltage $V_{DS}$ of a low-side transistor LSS in the related art. Switching edges 9 of drain voltage $V_{DS}$ are in this case comparatively sharp and result in overvoltages (see also FIG. 4) if the duration of the switching operation is selected to be too short. Thus there only remains the choice of accepting longer switching times and greater switching losses in order to achieve a sufficient EMC compatibility.

FIG. 3 shows the drain current $I_{DS}$ and the drain voltage $V_{DS}$ of a low-side power switch LSS of a power switch system according to the present invention. Here the switching edges 10 of drain voltage $V_{DS}$ are now less steep and no longer result in overvoltages, even if the duration of the switching operation in the middle of the switching operation of the low-side transistor LSS is selected to be quite short. The greater steepness of the switching edge in the middle of the switching operation and the shorter switching time result in lower switching losses, while improving the EMC emission nevertheless.

Figure 4:
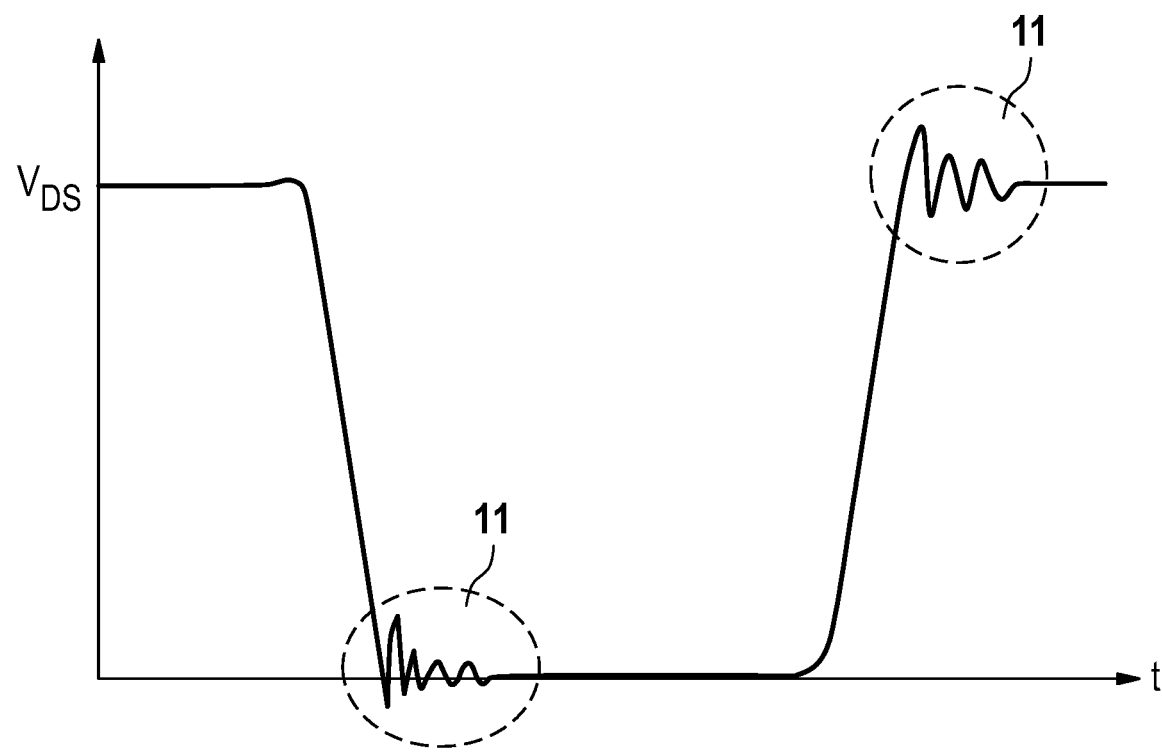
FIG. 4 shows a simplified diagram of the drain voltage of a power switch in the related art.
Figure 5:
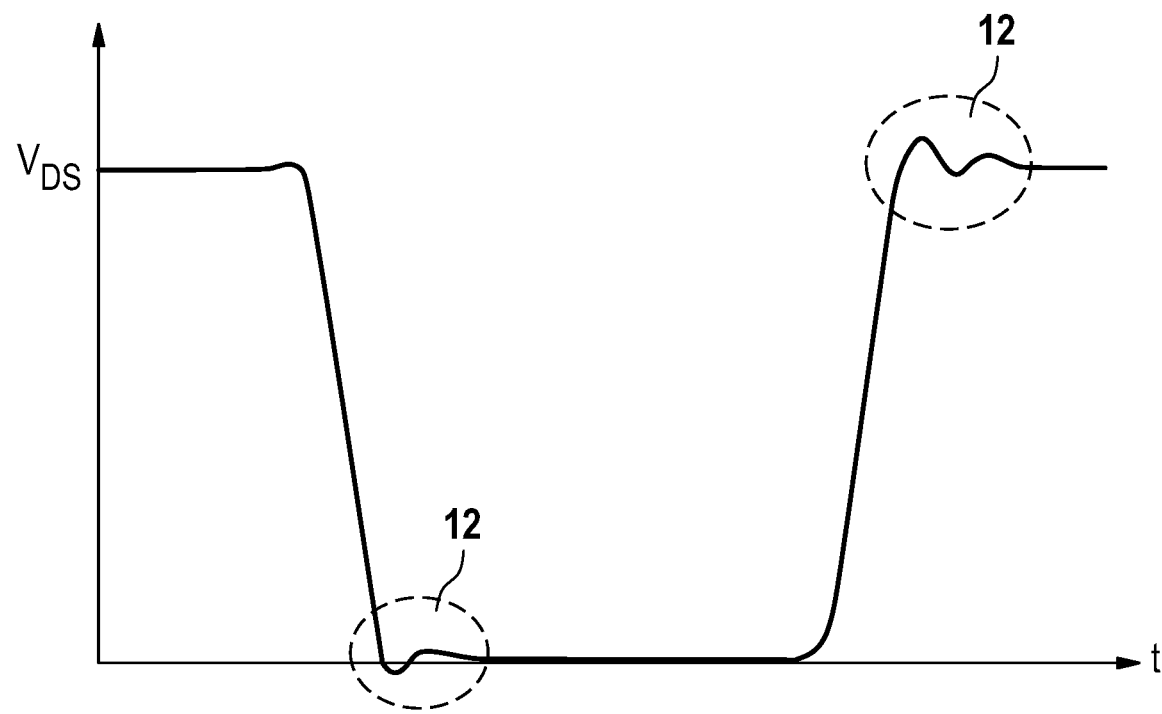
FIG. 5 shows a simplified diagram of the drain voltage of a power switch system according to the invention.

FIGS. 4 and 5 elucidate the main effect of the present invention. Compared to FIGS. 2 and 3, a somewhat more realistic curve of the drain voltage $V_{DS}$ of a low-side power switch LSS is shown in each case over time t across two switching operations.

FIG. 4 shows a low-side power switch LSS of the related art (corresponding to FIG. 2), which has a relatively short switching time, low switching losses and thus a steep switching edge. Unfortunately, such a low-side power switch LSS also results in switching oscillations 11 at the end of a switch-off operation or a switch-on operation that are quite pronounced. This may result in overvoltages and worsen the EMC compatibility.

FIG. 5 shows a low-side power switch LSS according to the present invention (corresponding to FIG. 3), which has a relatively short switching time, low switching losses and thus a steep switching edge. Because of the fact that the low-side transistor LSS now comprises at least two transistor segments LSS1, LSS2, LSS3, which have a different electrical resistance R1, R2, R3 in the connection to storage inductor L, it is possible to achieve markedly reduced switching oscillations 12 at the end of a switch-off operation or a switch-on operation by a staggered switching of transistor segments LSS1, LSS2, LSS3. Overvoltages are thereby reduced and the EMC compatibility is improved, without markedly increasing switching losses.

What is claimed is:

1. A power switch system, comprising:
a low-side transistor;
a high-side transistor, wherein the low-side transistor and the high-side transistor are configured so that they are switched to be conductive or switched to be blocking in respectively mutually alternating time segments of a switching period of the power switch system; and a plurality of resistors,
wherein a source terminal of the low-side transistor is connected to a load terminal and a drain terminal of the low-side transistor is connected to a supply voltage via a storage inductor,
wherein a drain terminal of the high-side transistor is connected to the load terminal, and a source terminal of high-side transistor is connected to the supply voltage via the storage inductor,
wherein the low-side transistor includes at least two transistor segments, at least two of the transistor segments having a different electrical resistance in the connection to the storage inductor, and
wherein the power switch system is configured so that at least two of the transistor segments are switched at a different point in time during a switching operation of the power switch system,
wherein the power switch system is configured so that each one of the transistor segments is assigned to its own gate segment of a gate terminal of the low-side transistor, an associated transistor segment being switched by switching one of the gate segments,
wherein the gate terminal is segmented in accordance with the transistor segments so that switching the gate segment effects switching of the associated transistor segment,
wherein a first terminal of the plurality of resistors is coupled to a drain terminal of the at least two transistor segments, and a second end of the plurality of resistors is coupled to a terminal of the inductor.

2. The power switch system of claim 1, wherein at least two of the transistor segments include differently sized area proportions of the low-side transistor.

3. A power switch system, comprising:
a low-side transistor;
a high-side transistor, wherein the low-side transistor and the high-side transistor are configured so that they are switched to be conductive or switched to be blocking in respectively mutually alternating time segments of a switching period of the power switch system; and a plurality of resistors,
wherein a source terminal of the low-side transistor is connected to a load terminal and a drain terminal of the low-side transistor is connected to a supply voltage via a storage inductor,
wherein a drain terminal of the high-side transistor is connected to the load terminal, and a source terminal of high-side transistor is connected to the supply voltage via the storage inductor,
wherein the low-side transistor includes at least two transistor segments, at least two of the transistor segments having a different electrical resistance in the connection to the storage inductor, and
wherein the power switch system is configured so that at least two of the transistor segments are switched at a different point in time during a switching operation of the power switch system,
wherein the power switch system is configured so that a time interval during a switching operation between switching two consecutively connected transistor segments is less than 100 ns,
wherein a first terminal of the plurality of resistors is coupled to a drain terminal of the at least two transistor segments, and a second end of the plurality of resistors is coupled to a terminal of the inductor.

4. A power switch system, comprising:
a low-side transistor; and
a high-side transistor, wherein the low-side transistor and the high-side transistor are configured so that they are switched to be conductive or switched to be blocking in respectively mutually alternating time segments of a switching period of the power switch system;

wherein a source terminal of the low-side transistor is connected to a load terminal and a drain terminal of the low-side transistor is connected to a supply voltage via a storage inductor, wherein a drain terminal of the high-side transistor is connected to the load terminal, and a source terminal of high-side transistor is connected to the supply voltage via the storage inductor, wherein the low-side transistor includes at least two transistor segments, at least two of the transistor segments having a different electrical resistance in the connection to the storage inductor, and wherein the power switch system is configured so that at least two of the transistor segments are switched at a different point in time during a switching operation of the power switch system, wherein the power switch system is configured so that in a switching operation of the low-side transistor the transistor segments are switched sorted according to their electrical resistance to the storage inductor.

5. The power switch system of claim 4, wherein the power switch system is configured so that in a switch-on operation of the low-side transistor the transistor segments are switched on in sequence from a highest resistance to the lowest resistance in time-staggered fashion.

6. The power switch system of claim 4, wherein the power switch system is configured so that in a switch-off operation of the low-side transistor the transistor segments are switched off in sequence from the lowest resistance to a highest resistance in time-staggered fashion.

7. A power switch system, comprising:

a low-side transistor;

a high-side transistor, wherein the low-side transistor and the high-side transistor are configured so that they are switched to be conductive or switched to be blocking in respectively mutually alternating time segments of a switching period of the power switch system; and a plurality of resistors, wherein a source terminal of the low-side transistor is connected to a load terminal and a drain terminal of the low-side transistor is connected to a supply voltage via a storage inductor, wherein a drain terminal of the high-side transistor is connected to the load terminal, and a source terminal of high-side transistor is connected to the supply voltage via the storage inductor, wherein the low-side transistor includes at least two transistor segments, at least two of the transistor segments having a different electrical resistance in the connection to the storage inductor, and wherein the power switch system is configured so that at least two of the transistor segments are switched at a different point in time during a switching operation of the power switch system, wherein the power switch system is configured so that a time interval during a switching operation between switching two consecutively connected transistor segments is less than 30 ns, wherein a first terminal of the plurality of resistors is coupled to a drain terminal of the at least two transistor segments, and a second end of the plurality of resistors is coupled to a terminal of the inductor.

8. A power switch system, comprising:

a low-side transistor;

a high-side transistor, wherein the low-side transistor and the high-side transistor are configured so that they are switched to be conductive or switched to be blocking in respectively mutually alternating time segments of a switching period of the power switch system; and a plurality of resistors, wherein a source terminal of the low-side transistor is connected to a load terminal and a drain terminal of the low-side transistor is connected to a supply voltage via a storage inductor, wherein a drain terminal of the high-side transistor is connected to the load terminal, and a source terminal of high-side transistor is connected to the supply voltage via the storage inductor, wherein the low-side transistor includes at least two transistor segments, at least two of the transistor segments having a different electrical resistance in the connection to the storage inductor, and wherein the power switch system is configured so that at least two of the transistor segments are switched at a different point in time during a switching operation of the power switch system, wherein the power switch system is configured so that a time interval during a switching operation between switching two consecutively connected transistor segments is less than 5 ns, wherein a first terminal of the plurality of resistors is coupled to a drain terminal of the at least two transistor segments, and a second end of the plurality of resistors is coupled to a terminal of the inductor.

* * * * *